(12) United States Patent
King, Jr. et al.

(10) Patent No.: US 11,958,374 B2
(45) Date of Patent: Apr. 16, 2024

(54) STANDALONE OR NETWORKED ELECTRIC VEHICLE SUPPLY EQUIPMENT (EVSE) TO DETECT AND STOP ARCING BEFORE IT BECOMES DANGEROUS

(71) Applicant: Siemens Industry, Inc., Alpharetta, GA (US)

(72) Inventors: William A. King, Jr., Loganville, GA (US); Elton C. Johnson, Decatur, GA (US); Harry Price Haas, Atlanta, GA (US); Matthew Leidy, Norcross, GA (US)

(73) Assignee: Siemens Industry, Inc., Alpharetta, GA (US)

( * ) Notice: Subject to any disclaimer, the term of this patent is extended or adjusted under 35 U.S.C. 154(b) by 202 days.

(21) Appl. No.: 17/008,069

(22) Filed: Aug. 31, 2020

(65) Prior Publication Data
US 2022/0063434 A1 Mar. 3, 2022

(51) Int. Cl.
*H02J 7/00* (2006.01)
*B60L 53/16* (2019.01)
*B60L 53/18* (2019.01)
*B60L 53/62* (2019.01)
*H02J 7/14* (2006.01)

(52) U.S. Cl.
CPC ............ *B60L 53/62* (2019.02); *B60L 53/16* (2019.02); *B60L 53/18* (2019.02); *H02J 7/0031* (2013.01); *H02J 7/0047* (2013.01)

(58) Field of Classification Search
USPC ........................................ 320/134, 107, 136
See application file for complete search history.

(56) References Cited

U.S. PATENT DOCUMENTS 6,459,273 B1* 10/2002 Dollar, II ............. H02H 1/0015
324/520
10,608,466 B1* 3/2020 Wildstone ............... H02J 9/061
(Continued)

FOREIGN PATENT DOCUMENTS

KR 102099343 B1 4/2020

OTHER PUBLICATIONS

Kumpulainen Lauri et al: "Aspects of arc-flash protection and prediction", Electric Power Systems Research, vol. 116, Jun. 7, 2014 (Jun. 7, 2014), pp. 77-86, XP055876817,Amsterdam, Nlissn: 0378-7796, DOI:10.1016/j.epsr.2014.05.01, figures 1,8 *see Sections 4-6; p. 79-p. 84.

*Primary Examiner* — Alexis B Pacheco

(57) ABSTRACT

An electric vehicle supply equipment (EVSE) is provided with an integrated arc fault detection circuit interruption (AFCI) device to supply electricity to an electric vehicle (EV) being a load. The EVSE comprises a coupler and an AFCI device including: a controller including a processor and a memory, circuitry and computer-readable firmware code stored in the memory which, when executed by the processor, causes the controller to: detect an arcing level of arcing between the coupler and a charge port of the EV or any other series or parallel arcing within the EVSE, compare the arcing level to a threshold level to determine a hazardous nature of arching, and analyze the arcing level to determine not only if it is currently hazardous but if it is likely to become hazardous in a near term and recommend repair or replacement of the coupler and the charge port before damage occurs.

19 Claims, 7 Drawing Sheets

(56) References Cited

U.S. PATENT DOCUMENTS

| | | | |
|---|---|---|---|
| 11,282,369 B2* | 3/2022 | Bickel | H02J 13/00002 |
| 2005/0286184 A1 | 12/2005 | Campolo | |
| 2011/0169447 A1* | 7/2011 | Brown | B60L 53/68 |
| | | | 320/109 |
| 2012/0206100 A1* | 8/2012 | Brown | B60L 53/18 |
| | | | 320/109 |
| 2013/0300429 A1* | 11/2013 | Jefferies | B60L 53/31 |
| | | | 324/511 |
| 2016/0163186 A1* | 6/2016 | Davidson | G06Q 50/06 |
| | | | 340/506 |
| 2018/0045767 A1* | 2/2018 | Daigle | G01R 35/00 |
| 2018/0097354 A1* | 4/2018 | Yoscovich | H02S 50/00 |
| 2018/0201142 A1* | 7/2018 | Galin | H02J 4/00 |
| 2019/0157869 A1* | 5/2019 | Gadh | B60L 53/66 |
| 2020/0006934 A1* | 1/2020 | Malacara-Carrillo | |
| | | | H01H 71/10 |
| 2021/0126450 A1* | 4/2021 | Zeng | G01R 31/086 |
| 2021/0218241 A1* | 7/2021 | Kitamura | H02H 3/445 |
| 2021/0278453 A1* | 9/2021 | Denney | H02H 1/0015 |
| 2021/0387537 A1* | 12/2021 | Bech | B60L 53/16 |
| 2021/0391672 A1* | 12/2021 | Van der Heijden | |
| | | | H01R 13/7135 |
| 2022/0063434 A1* | 3/2022 | King, Jr. | B60L 53/16 |

* cited by examiner

STANDALONE OR NETWORKED ELECTRIC VEHICLE SUPPLY EQUIPMENT (EVSE) TO DETECT AND STOP ARCING BEFORE IT BECOMES DANGEROUS

BACKGROUND

1. Field

Aspects of the present invention generally relate to an electric vehicle supply equipment (EVSE) that is capable of detecting and stopping arcing before it becomes dangerous.

2. Description of the Related Art

An electric vehicle supply equipment (EVSE) supplies electricity to an electric vehicle (EV) being a load. Commonly called charging stations or charging docks, they provide electric power to the electric vehicle and use that to recharge the vehicle's batteries. The EVSE is an element in an infrastructure that supplies electric energy for the recharging of plug-in electric vehicles-including electric cars, neighborhood electric vehicles and plug-in hybrids. Charging stations provide a range of heavy duty or special connectors that conform to the variety of standards. For common DC rapid charging, multi-standard chargers equipped with two or three of the Combined Charging System (CCS), CHAdeMO, and AC fast charging has become the de facto market standard in many regions. An EV owner plugs into a standard receptacle (such as NEMA connector in the US) when he or she returns home, and the car recharges overnight.

Although the rechargeable electric vehicles and equipment can be recharged from a domestic wall socket, a charging station is usually accessible to multiple electric vehicles and has additional current or connection sensing mechanisms to disconnect the power when the EV is not charging. There are two main types of safety sensor: Current sensors and sensor wires. Current sensors which monitor the power consumed, and maintain the connection only if the demand is within a predetermined range. Sensor wires react more quickly, have fewer parts to fail and are possibly less expensive to design and implement. Current sensors however can use standard connectors and can readily provide an option for suppliers to monitor or charge for the electricity actually consumed. Additional physical "sensor wires" which provide a feedback signal such as specified by the undermentioned SAE J1772 and IEC 62196 schemes that require special (multi-pin) power plug fittings.

The US-based SAE International defines Level 1 charging as using a standard 120 volt AC house outlet to charge an electric vehicle. 240 volt AC charging is known as Level 2 charging. They can charge an electric car battery in 4-10 hours. Level 2 chargers are often placed at destinations so that drivers can charge their car while at work or shopping. "AC Level 3" charging was defined in early editions of SAE J1772 at up to 400 amps, but has been dropped. DC charging generally supports charging up to 500 volts for passenger cars. Some newer high-end passenger car EVs and many heavy duty EV trucks and buses use DC charging with a nominal DC voltage of 700 V or higher, but below 1000 V peak. The International Electrotechnical Commission, defines charging in modes: Mode 3—slow or fast charging using a specific EV multi-pin socket with control and protection functions (e.g., SAE J1772 and IEC 62196). There are four plug types: Type 1—single-phase vehicle coupler—reflecting the SAE J1772/2009 automotive plug specifications.

However, when charging adapters are used between an EVSE and various electric vehicles arcing which can be dangerous to people and damaging to equipment can occur. There is presently no known solution to this problem. It would be possible to use an arc fault detection circuit interruption (AFCT) type circuit breaker wired in series in front of an EVSE, but electric vehicles (EVs) require much higher currents to charge than any AFCI currently on the market.

Therefore, there is a need for a simplified means to avoid and handle arcing between charging connectors of an EVSE and charging ports of electric vehicles (EVs).

SUMMARY

Briefly described, aspects of the present invention relate to an electric vehicle supply equipment (EVSE), standalone or networked, that can detect and stop arcing before it becomes dangerous. An electric vehicle supply equipment (EVSE) comprises an arc fault detection circuit interruption (AFCI) device configured to detect an arcing level of arcing between a coupler and a charge port of an electric vehicle (EV), compare the arcing level to a threshold level to determine a hazardous nature of arching, and analyze the arcing level to determine not only if it is currently hazardous but if it is likely to become hazardous in a near term and recommend repair or replacement of the coupler and the charge port before damage occurs. This invention applies the knowledge applied in arc fault circuit interrupters, both circuitry and firmware to electric vehicle supply equipment. This invention is to detect and stop the arcing before it becomes dangerous.

In accordance with one illustrative embodiment of the present invention, an electric vehicle supply equipment (EVSE) is provided that supplies electricity to an electric vehicle (EV) being a load. The EVSE comprises a coupler and an arc fault detection circuit interruption (AFCI) device. The AFCI device includes a controller including a processor and a memory, circuitry and computer-readable firmware code stored in the memory which, when executed by the processor, causes the controller to: detect an arcing level of arcing between the coupler and a charge port of the electric vehicle (EV) or any other series or parallel arcing within the EVSE, compare the arcing level to a threshold level to determine a hazardous nature of arching, and analyze the arcing level to determine not only if it is currently hazardous but if it is likely to become hazardous in a near term and recommend repair or replacement of the coupler and the charge port before damage occurs.

In accordance with one illustrative embodiment of the present invention, a method for supplying electricity to an electric vehicle (EV) being a load is provided. The method comprises providing an electric vehicle supply equipment (EVSE) comprising a coupler and an arc fault detection circuit interruption (AFCI) device. The AFCI device includes a controller including a processor and a memory, circuitry and computer-readable firmware code stored in the memory which, when executed by the processor, causes the controller to: detect an arcing level of arcing between the coupler and a charge port of the electric vehicle (EV), compare the arcing level to a threshold level to determine a hazardous nature of arching, and analyze the arcing level to determine not only if it is currently hazardous but if it is likely to become hazardous in a near term and recommend repair or replacement of the coupler and the charge port before damage occurs.

DETAILED DESCRIPTION

Figure 1:
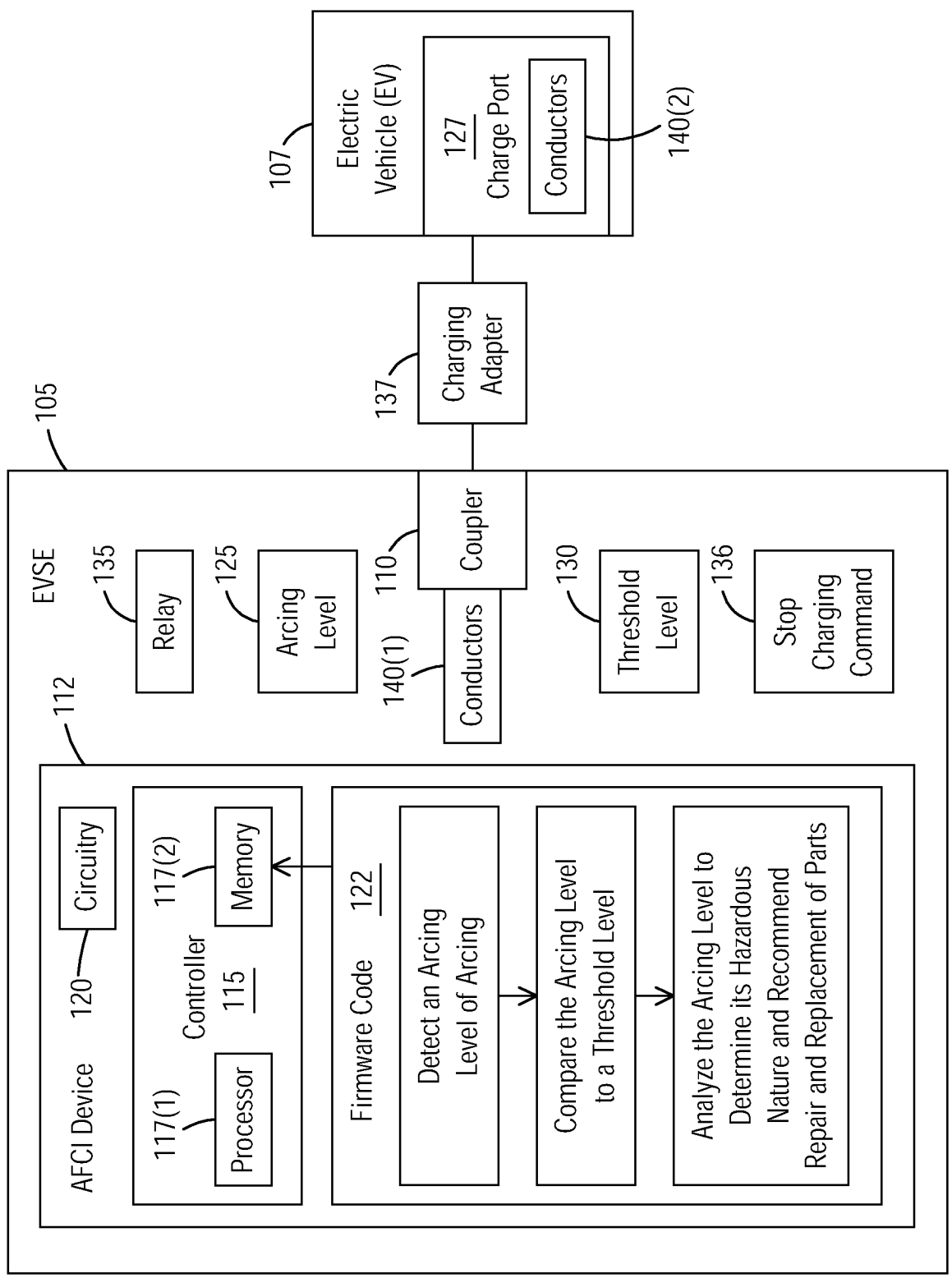
FIG. 1 illustrates a block diagram of an electric vehicle supply equipment (EVSE) that supplies electricity to an electric vehicle (EV) being a load in accordance with an exemplary embodiment of the present invention.

To facilitate an understanding of embodiments, principles, and features of the present invention, they are explained hereinafter with reference to implementation in illustrative embodiments. In particular, they are described in the context of an arc fault detection circuit interruption (AFCI) type circuit breaker integrated into an electric vehicle supply equipment (EVSE) for detecting and stopping arcing between charging connectors of an EVSE and charging ports of electric vehicles (EVs). The present invention applies the knowledge applied in arc fault circuit interrupters, both circuitry and firmware to electric vehicle supply equipment. The present invention is to detect and stop the arcing before it becomes dangerous. Embodiments of the present invention, however, are not limited to use in the described devices or methods.

The components and materials described hereinafter as making up the various embodiments are intended to be illustrative and not restrictive. Many suitable components and materials that would perform the same or a similar function as the materials described herein are intended to be embraced within the scope of embodiments of the present invention.

These and other embodiments of the electric vehicle supply equipment (EVSE) according to the present disclosure are described below with reference to FIGS. 1-10 herein. Like reference numerals used in the drawings identify similar or identical elements throughout the several views. The drawings are not necessarily drawn to scale.

Consistent with one embodiment of the present invention, FIG. 1 represents a perspective view of an electric vehicle supply equipment (EVSE) 105 in accordance with an exemplary embodiment of the present invention. The EVSE 105 supplies electricity to an electric vehicle (EV) 107 being a load in accordance with an exemplary embodiment of the present invention. The EVSE 105 comprises a coupler 110 and an arc fault detection circuit interruption (AFCI) device 112. The AFCI device 112 includes a controller 115 including a processor 117(1) and a memory 117(2). The AFCI device 112 further includes circuitry 120 for supplying electricity and computer-readable firmware code 122 stored in the memory 117(2) which, when executed by the processor 117(1), causes the controller 115 to: detect an arcing level 125 of arcing between the coupler 110 and a charge port 127 of the electric vehicle (EV) 107 or any other series or parallel arcing within the EVSE 105, compare the arcing level 125 to a threshold level 130 to determine a hazardous nature of arching, and analyze the arcing level 125. The arcing level 125 is analyzed to determine not only if it is currently hazardous but if it is likely to become hazardous in a near term and recommend repair or replacement of the coupler 110 and the charge port 127 before damage occurs.

The arcing happens when the electric vehicle supply equipment (EVSE) 105 is unplugged in an unusual manner. The arcing also happens whenever there is an electric power present on the charge port 127 of the electric vehicle (EV) 107 when there shouldn't be any. The arcing is defined as generating a lot more electrical noise than a threshold.

The electric vehicle supply equipment (EVSE) 105 further comprises a relay 135 configured to open and close to supply power or cutoff power. If any arcing is detected by the electric vehicle supply equipment (EVSE) 105, the electric vehicle supply equipment (EVSE) 105 initiates a stop charging command 136 to open the relay 135 to cutoff the power to the charge port 127.

The electric vehicle supply equipment (EVSE) 105 further comprises a charging adapter 137 being used between the coupler 110 of the electric vehicle supply equipment (EVSE) 105 and the charge port 127 of the electric vehicle (EV) 107 such that the arcing can be damaging to people and equipment.

The controller 115 is configured to detect and stop the arcing before it becomes dangerous. The controller 115 is configured to monitor the arcing and overtime determine if conductors 140(1) of the coupler 110 and conductors 140(2) of the charge port 127 are worn out. The controller 115 is configured to predict when the arcing is going to occur in future. The controller 115 is configured to suggest to replace the coupler 110 or the charge port 127 based on a worn out condition of the conductors 140(1) of the coupler 110 and the conductors 140(2) of the charge port 127. The controller 115 is configured to continue charging in case of no arcing.

The controller 115 is configured to accumulate information about a level of arcing, a duration of arcing, a number of times arching happened to predict health of the coupler 110 based on arc energy. The controller 115 is configured to record a time, a date and a location information of arcing and correlate the time, the date and the location information with billing to identify where arcing was a consistent problem.

Figure 2:
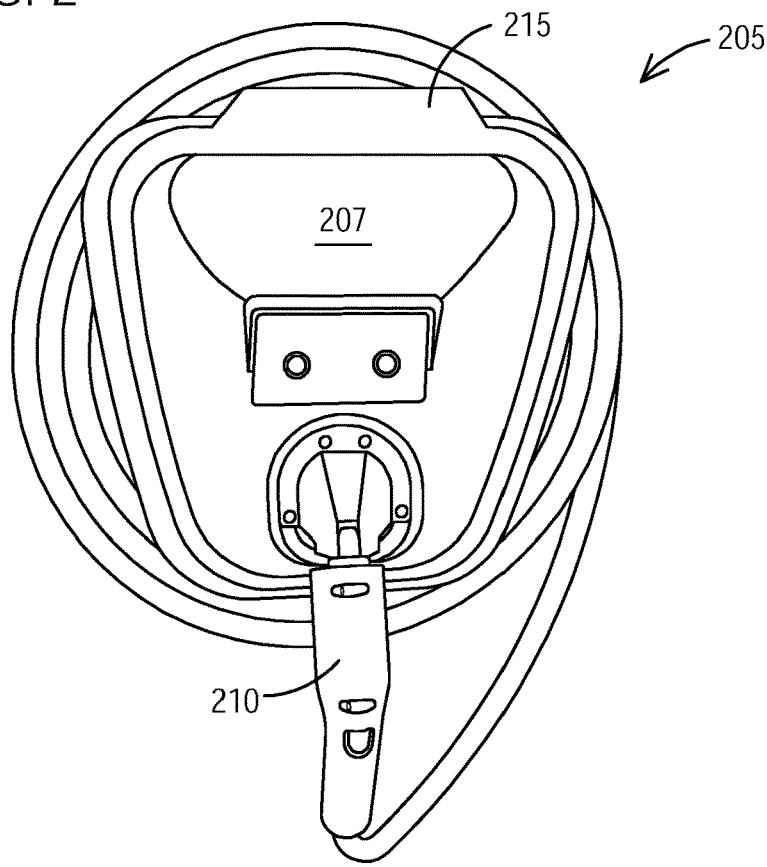
FIG. 2 illustrates a perspective view of an electric vehicle supply equipment (EVSE) in accordance with an exemplary embodiment of the present invention.

Referring to FIG. 2, it illustrates a perspective view of an electric vehicle supply equipment (EVSE) 205 in accordance with an exemplary embodiment of the present invention. The EVSE 205 comprises a body 207 and a wired coupler 210 connected to the body 207. The wired coupler 210 is configured such that it can mount on mounting means 215 of the body 207.

Figure 3:
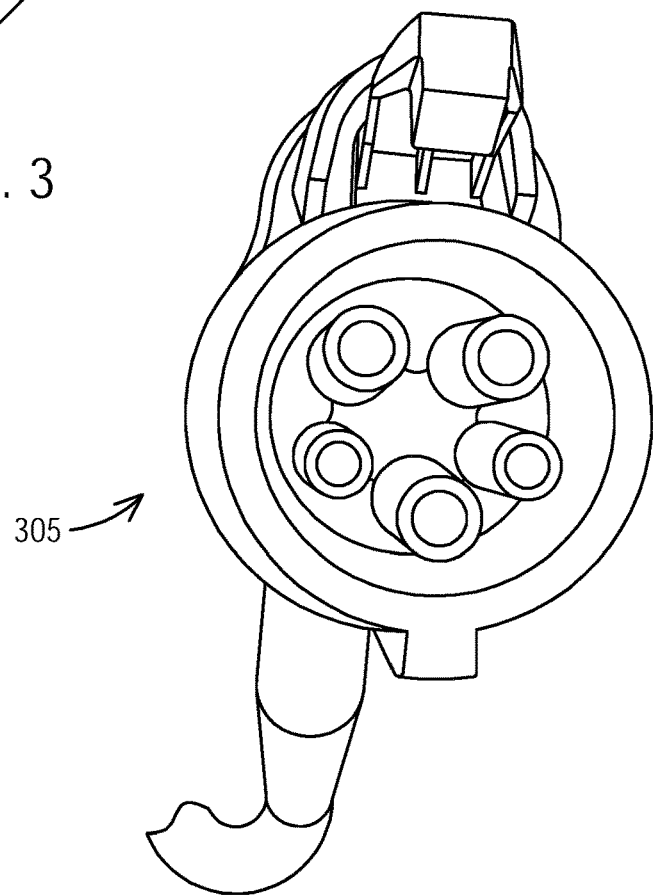
FIG. 3 illustrates a front view of a coupler of the electric vehicle supply equipment (EVSE) of FIG. 2 in accordance with an exemplary embodiment of the present invention.

Turning now to FIG. 3, it illustrates a front view of a coupler 305 or electric vehicle connector of the electric vehicle supply equipment (EVSE) 205 of FIG. 2 in accordance with an exemplary embodiment of the present invention. The coupler 305 comprises a J1772 interface. SAE J1772 (IEC Type 1), also known as a J plug, is a North American standard for electrical connectors for electric vehicles maintained by the SAE International and has the formal title "SAE Surface Vehicle Recommended Practice J1772, SAE Electric Vehicle Conductive Charge Coupler. It covers the general physical, electrical, communication protocol, and performance requirements for the electric vehicle conductive charge system and coupler. The intent is to define a common electric vehicle conductive charging system architecture including operational requirements and the functional and dimensional requirements for the vehicle inlet and mating connector.

Figure 4:
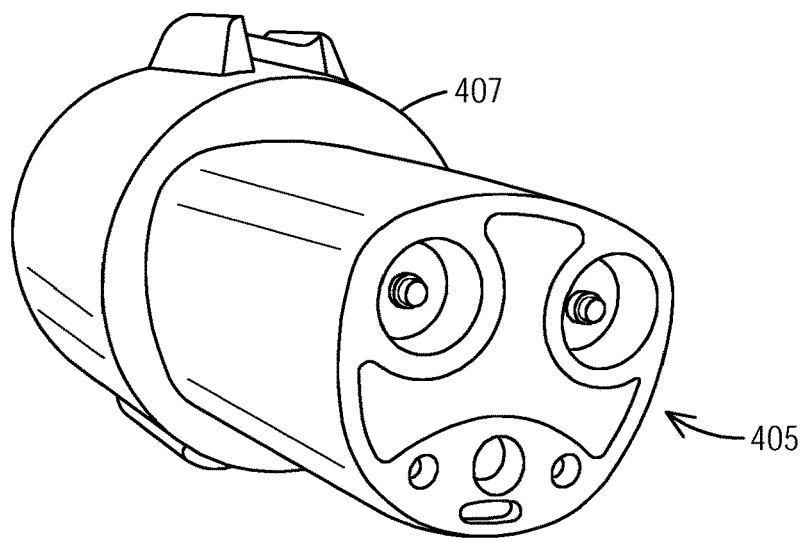
FIG. 4 illustrates a perspective view of a J1772 Tesla adapter Tesla end in accordance with an exemplary embodiment of the present invention.

FIG. 4 illustrates a perspective view of a Tesla end 405 of a J1772 Tesla adapter 407 in accordance with an exemplary embodiment of the present invention. The other opposite end (not seen) of the J1772 Tesla adapter 407 is a J1772 end which is configured to fit in the coupler 305 of the EVSE 205. The Tesla end 405 interfaces with a charge port of a Tesla car. The 31772 Tesla adapter 407 enables a J1772 coupler to be used with a Tesla charge port to charge a Tesla car.

Figure 5:
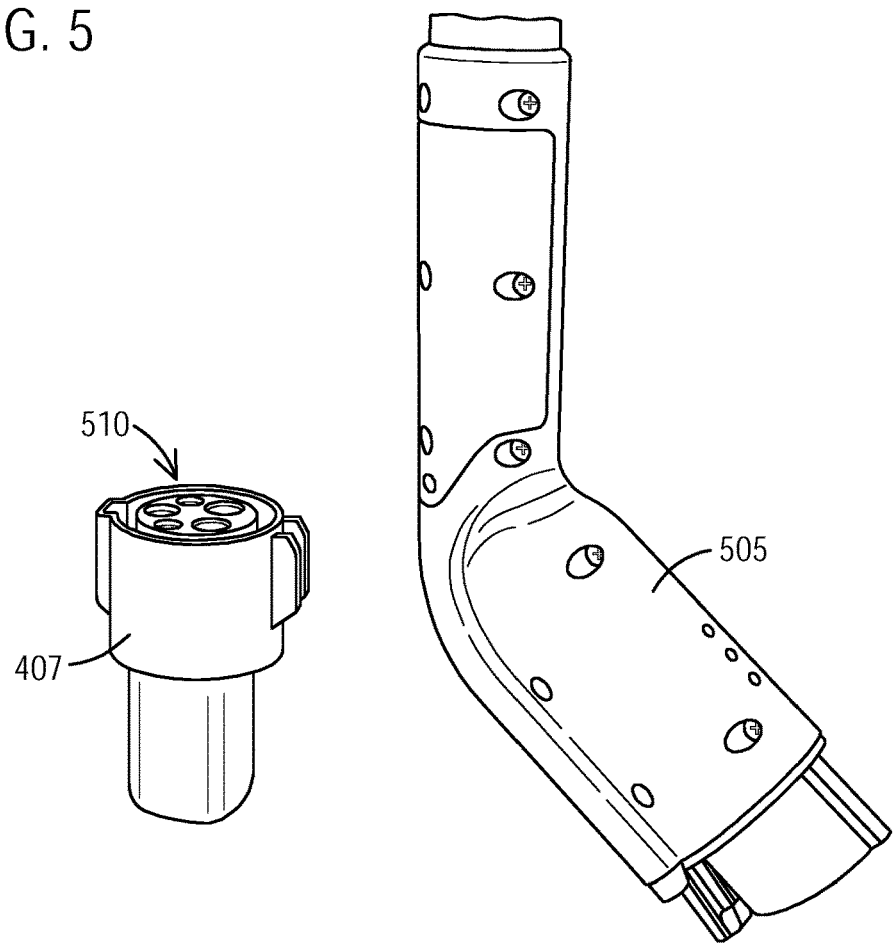
FIG. 5 illustrates a perspective view of a coupler of the electric vehicle supply equipment (EVSE) and a J1772 Tesla adapter J1772 end in accordance with an exemplary embodiment of the present invention.

As seen in FIG. 5, it illustrates a perspective view of a J1772 coupler 505 of the electric vehicle supply equipment (EVSE) 205 and the J1772 Tesla adapter 407 with a J1772 end 510 shown in accordance with an exemplary embodiment of the present invention. For example, an EVSE with a J1772 plug may use the J1772 Tesla adapter 407 to connect to the car. The J1772 Tesla adapter 407 generally can't be removed from the charge port if the car is locked. The J1772 Tesla adapter 407 may not allow a non-Tesla EV to use a supercharger. The only vehicles that do not use a SAE J1772 connector or a SAE J1772 coupler are Tesla vehicles, however, they can use the J1772 Tesla adapter 407 that comes with the vehicle. Siemens VersiCharge Level 2 EV charger includes an OEM J1772 Tesla adapter.

The industry standard connector in North America is the SAE J1772™ connector and EVSEs come standard with this type of connector or a J1772 plug. The SAE J1772 standard also covers the communication protocol used by the vehicle and charging station. The SAE J1772 standard connector is used for Level 1 (120V) and Level 2 (240V) charging. One caveat is that one Automaker, Tesla™, uses its own proprietary connection interface. The Tesla vehicles still utilize the SAE J1772 communications protocol, so Tesla vehicle owners can utilize standard SAE J1772 charging stations by utilizing a Tesla provided connector adapter such as the J1772 Tesla adapter 407.

Figure 6:
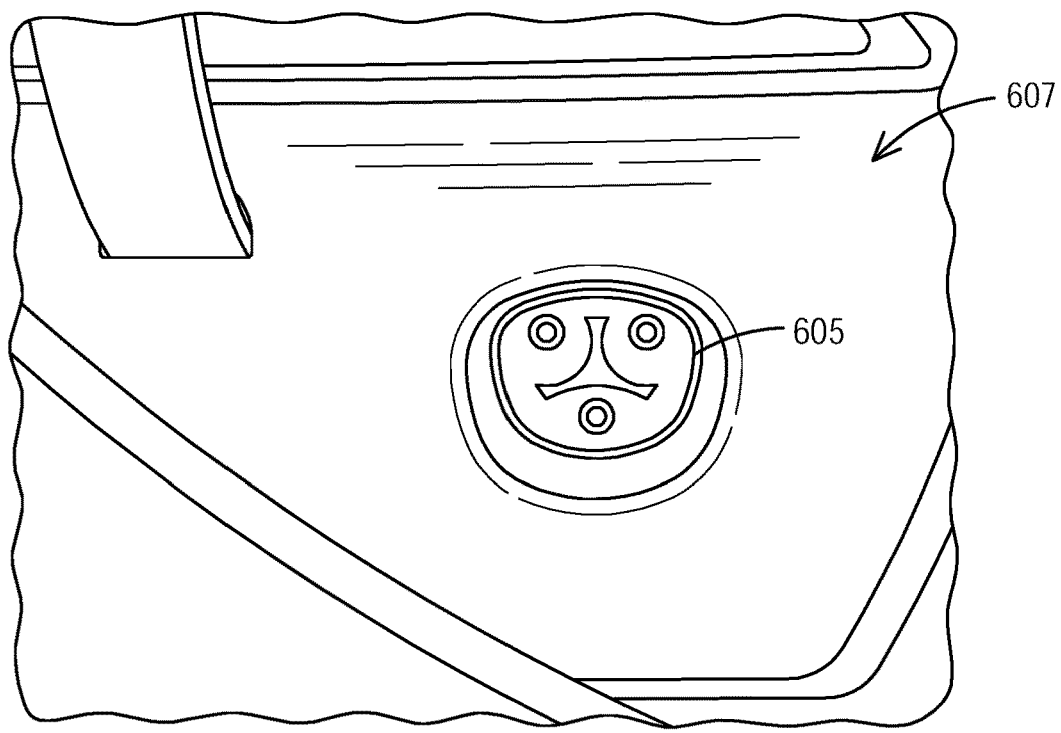
FIG. 6 illustrates a perspective view of a charge port of a Tesla car in accordance with an exemplary embodiment of the present invention.

As shown in FIG. 6, it illustrates a perspective view of a charge port 605 of a Tesla car 607 in accordance with an exemplary embodiment of the present invention. The charge port 605 on all Tesla vehicles is located within a tail light on the driver's side, but the actual connectors are different depending on the market. In the US and Canada, it features Tesla's own proprietary connector and in Europe, the company uses the standard Mennekes plug.

All electric cars, including Tesla vehicles, have a charge port (or two, in some cases). These charge ports have a special EV charging connector that connect compatible charging cables. There are four major charge port connectors in the US, with Tesla being one of them, and one of the most popular, especially as they continue to outsell other electric vehicles. The charge port 605 on the Tesla car 607 is located on the left rear of the vehicle near the taillight assembly is and integrated in such a way that the charge port door is hidden and neatly integrated into the design.

To open the charge port 605 door on the Tesla car 607, just simply bring the charging cable near the door, press the button on the cable and the door opens. Make sure the key is there, however, otherwise it won't work. One can also open the charge port via the screen in the car or using the Tesla app. Once one plugs in the cable, the Tesla car 607 will begin charging.

Figure 7:
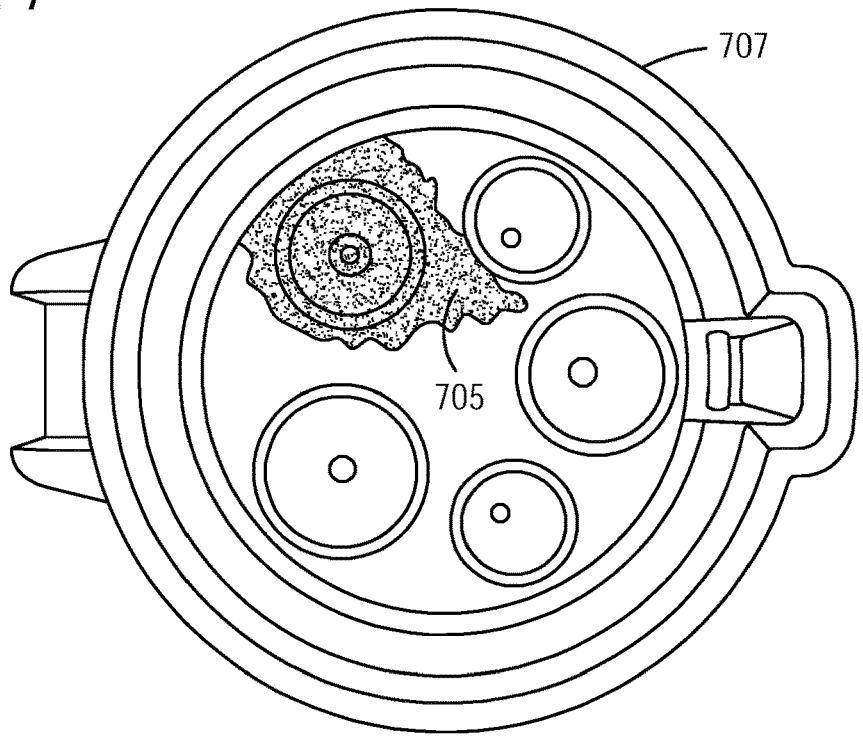
FIG. 7 illustrates a perspective view of damage to a charging adapter when there is arcing present.

In FIG. 7, it illustrates a perspective view of damage 705 to a charging adapter 707 when there is arcing present. A ground pin is of the first-make, last-break variety. If a J1772 plug is in the charge port 605 of a vehicle and charging, and it is removed, the shorter control pilot pin will break first causing the power relay in the EVSE 205 to open, stopping current flow to the J1772 plug. This prevents any arcing on the power pins.

Communication between a power source and a vehicle's battery and on-board charger is critical to ensure the safety of the user and the longevity of the battery and the charging connectors. Allowing the vehicle to detect when the J1772 plug is fully inserted allows the on-board charger and supply equipment to ensure that both sides of the connection are always safe to touch. The vehicle must detect when the latch is pressed on the connector to allow the vehicle to stop drawing power before the connector is unplugged to prevent arcing.

Many connectors have a mechanical or electronic latch. If the latch is disengaged, a proximity detector triggers the control module to immediately shut off the main relay, cutting power to the EV 607. This prevents arcing at the terminals when plugging or unplugging the cable at the EV's 607 charge port 605.

However, arcing causes the damage 705 and it happens when the electric vehicle supply equipment (EVSE) 205 is unplugged in an unusual manner. The arcing also happens whenever there is an electric power present on the charge port 605 of the electric vehicle (EV) 607 when there shouldn't be any.

Figure 8:
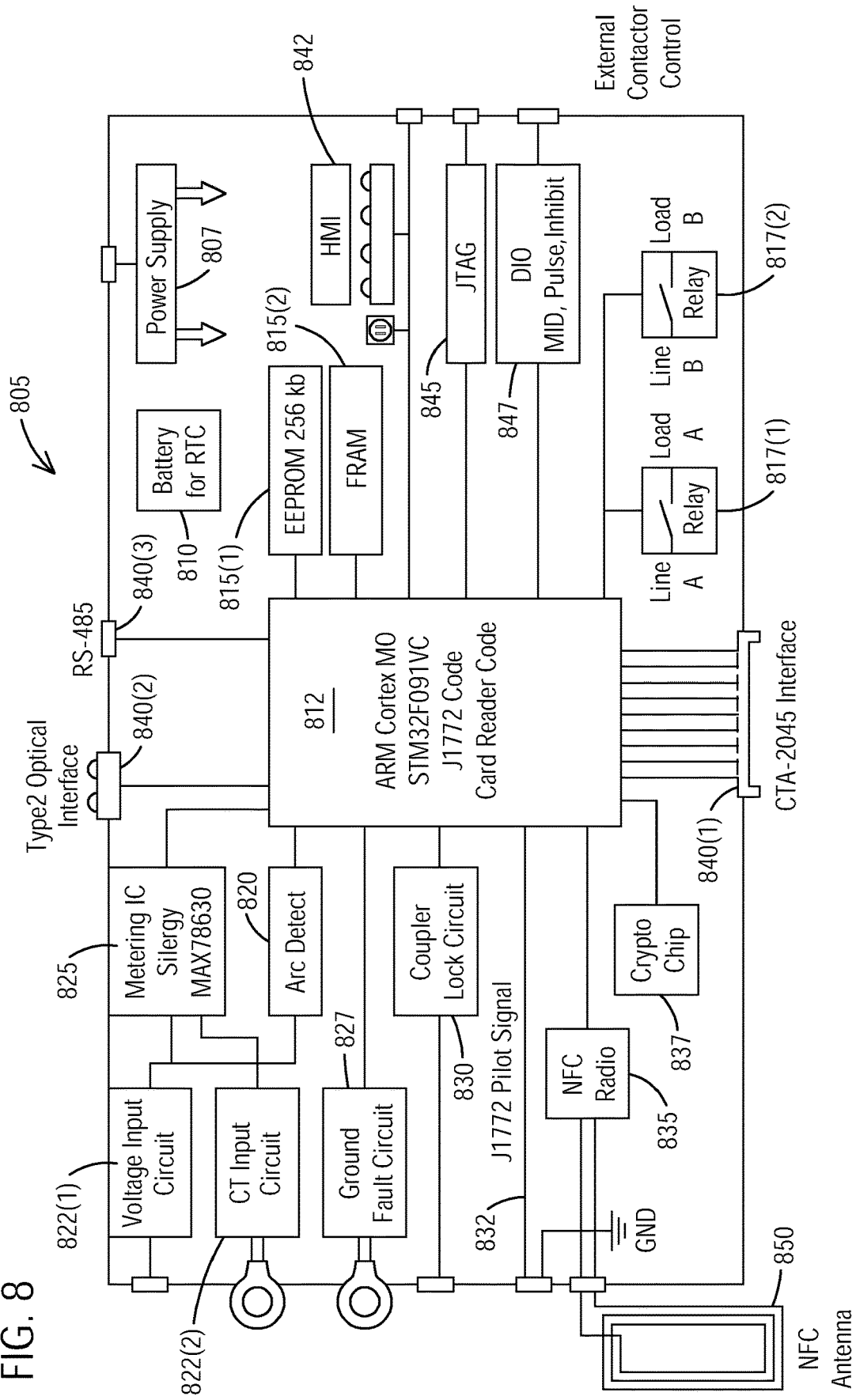
FIG. 8 illustrates a schematic view of an electric vehicle supply equipment (EVSE) in accordance with an exemplary embodiment of the present invention.

With regard to FIG. 8, it illustrates a schematic view of an electric vehicle supply equipment (EVSE) 805 in accordance with an exemplary embodiment of the present invention. The EVSE 805 comprises a power supply 807 and a battery 810. The EVSE 805 further comprises a processor 812, an EEPROM memory 815(1) and a FRAM memory 815(2). The EVSE 805 further comprises a relay A 817(1) and a relay B 817(2). The EVSE 805 further comprises an arc detect circuit 820 coupled to the processor 812, a voltage input circuit 822(1), and a metering IC 825. The EVSE 805 further comprises a CT input circuit 822(2) coupled to the metering IC 825. The EVSE 805 further comprises a ground fault circuit 827 coupled to the processor 812. The EVSE 805 further comprises a coupler lock circuit 830 coupled to the processor 812. The EVSE 805 further comprises a J1772 pilot signal 832 coupled to the processor 812. The EVSE 805 further comprises a NFC radio 835 coupled to the processor 812. The EVSE 805 further comprises crypto chip 837 coupled to the processor 812.

The processor 812 has a CTA-2045 interface 840(1), a type 2 optical interface 840(2) and a RS-485 interface 840(3). The EVSE 805 further comprises a HMI 842 coupled to the processor 812. The EVSE 805 further comprises a JTAG 845 coupled to the processor 812. The EVSE 805 further comprises a DIO 847 The EVSE 805 further comprises a NFC antenna 850 coupled to the NFC radio 835.

Figure 9:
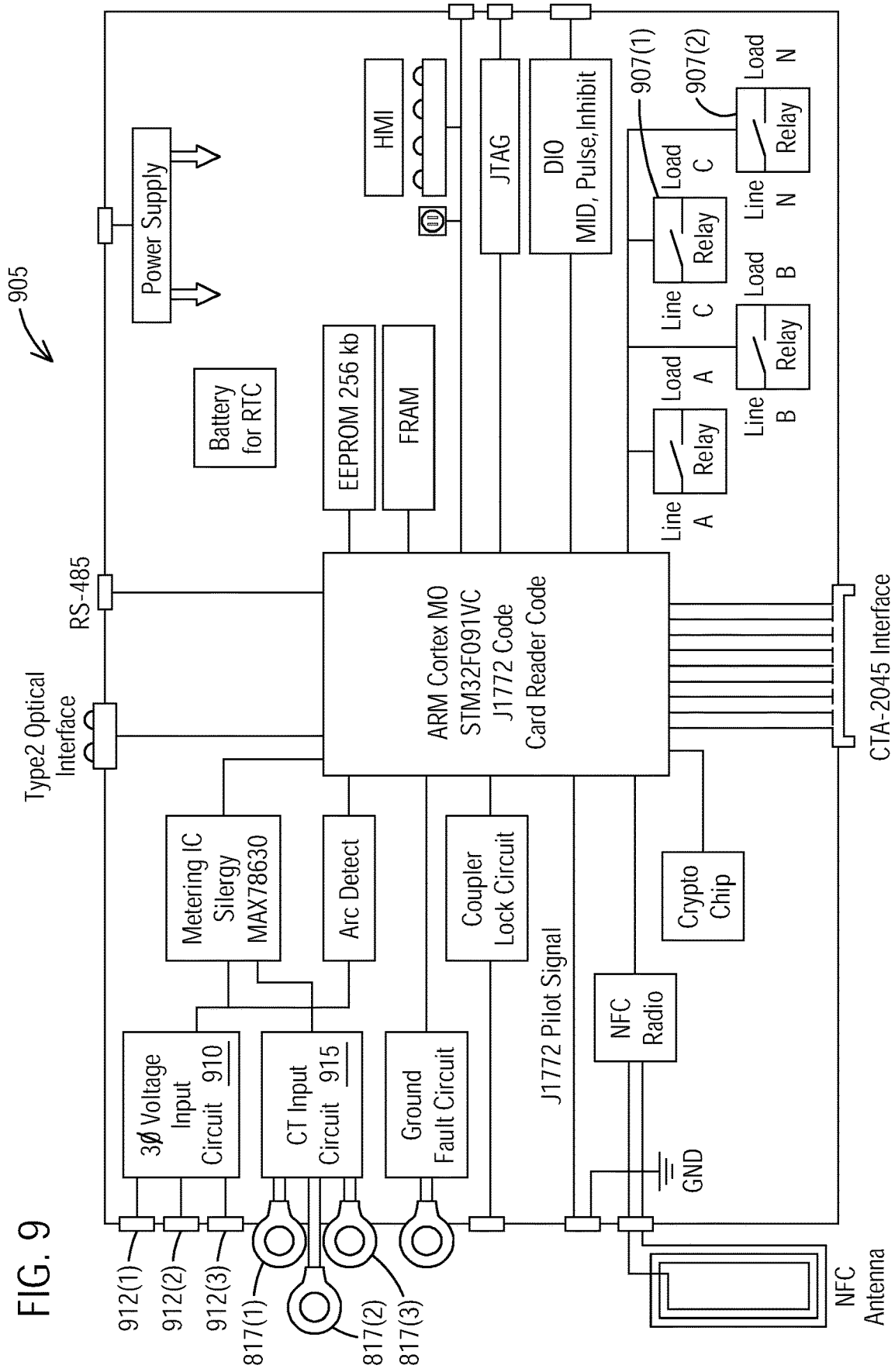
FIG. 9 illustrates a schematic view of an electric vehicle supply equipment (EVSE) in accordance with an exemplary embodiment of the present invention.

With respect to FIG. 9, it illustrates a schematic view of an electric vehicle supply equipment (EVSE) 905 in accordance with an exemplary embodiment of the present invention. In addition to components of the EVSE 805, the EVSE 905 further comprises a relay C 907(1) and a relay N 907(2). The EVSE 905 further comprises a voltage input circuit 910 with multiple inputs 912(1-3) and a CT input circuit 915 with multiple inputs 817(1-3).

Figure 10:
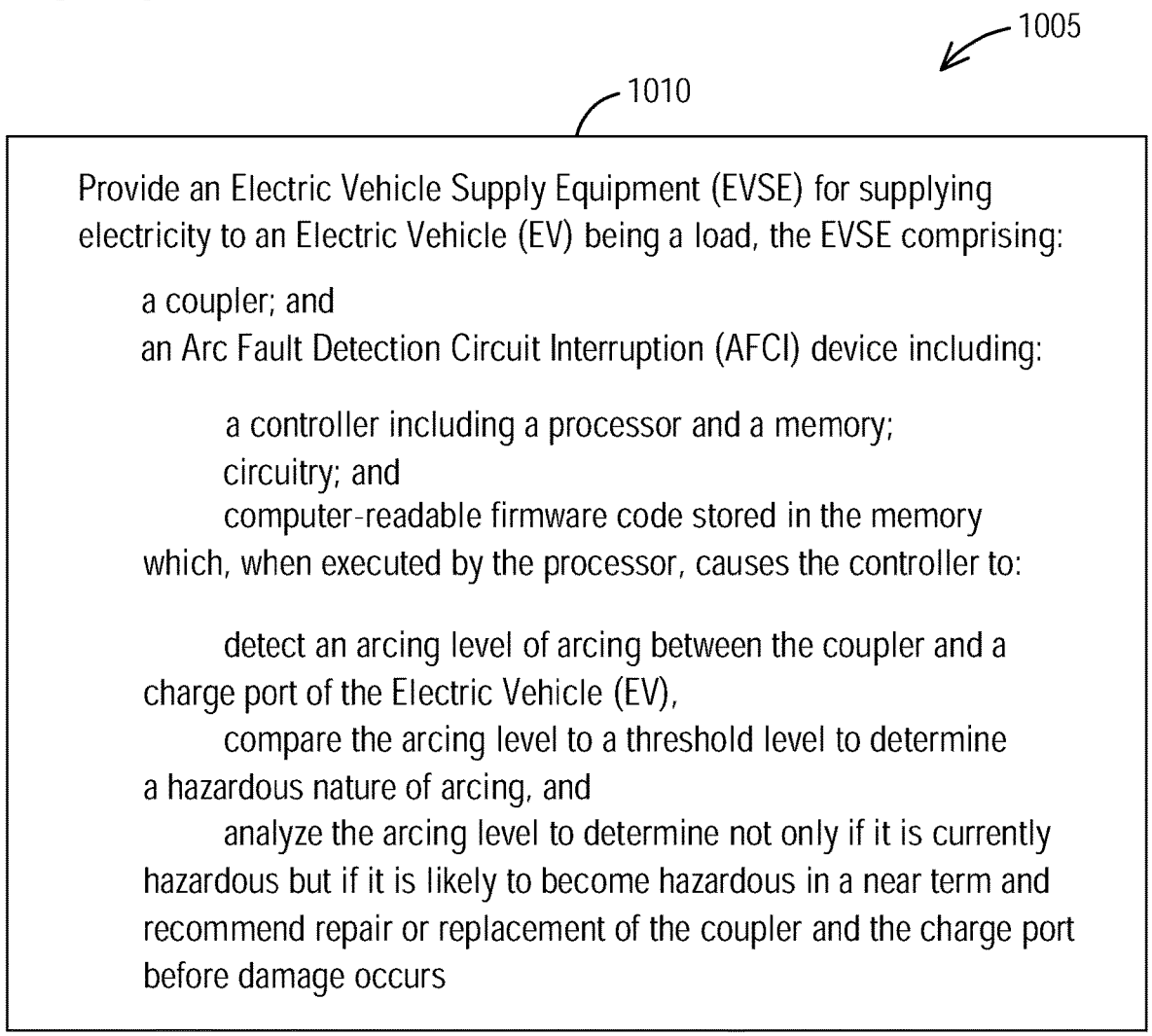
FIG. 10 illustrates a schematic view of a flow chart of a method for supplying electricity to an electric vehicle (EV) being a load in accordance with an exemplary embodiment of the present invention.

FIG. 10 illustrates a schematic view of a flow chart of a method 1005 for supplying electricity to an electric vehicle (EV) being a load in accordance with an exemplary embodiment of the present invention. Reference is made to the elements and features described in FIGS. 1-9. It should be appreciated that some steps are not required to be performed in any particular order, and that some steps are optional.

The method 1005 comprises a step 1010 of providing an electric vehicle supply equipment (EVSE) comprising a coupler and an arc fault detection circuit interruption (AFCI) device. The AFCI device includes a controller including a processor and a memory, circuitry and computer-readable firmware code stored in the memory which, when executed by the controller, causes the controller to: detect an arcing level of arcing between the coupler and a charge port of the electric vehicle (EV), compare the arcing level to a threshold level to determine a hazardous nature of arching, and analyze the arcing level to determine not only if it is currently hazardous but if it is likely to become hazardous in a near term and recommend repair or replacement of the coupler and the charge port before damage occurs.

While a physical arcing damage is described here a range of one or more other types of damage or other forms of damage are also contemplated by the present invention. For example, other types of EVSEs may be implemented based on one or more features presented above without deviating from the spirit of the present invention.

The techniques described herein can be particularly useful for an arc fault detection circuit interruption (AFCI) device. While particular embodiments are described in terms of an arc fault detection circuit interruption (AFCI) device, the techniques described herein are not limited to such a circuit but can also be used with other circuits or configurations.

While embodiments of the present invention have been disclosed in exemplary forms, it will be apparent to those skilled in the art that many modifications, additions, and deletions can be made therein without departing from the spirit and scope of the invention and its equivalents, as set forth in the following claims.

Embodiments and the various features and advantageous details thereof are explained more fully with reference to the non-limiting embodiments that are illustrated in the accompanying drawings and detailed in the following description. Descriptions of well-known starting materials, processing techniques, components and equipment are omitted so as not to unnecessarily obscure embodiments in detail. It should be understood, however, that the detailed description and the specific examples, while indicating preferred embodiments, are given by way of illustration only and not by way of limitation. Various substitutions, modifications, additions and/or rearrangements within the spirit and/or scope of the underlying inventive concept will become apparent to those skilled in the art from this disclosure.

As used herein, the terms "comprises," "comprising," "includes," "including," "has," "having" or any other variation thereof, are intended to cover a non-exclusive inclusion. For example, a process, article, or apparatus that comprises a list of elements is not necessarily limited to only those elements but may include other elements not expressly listed or inherent to such process, article, or apparatus.

Additionally, any examples or illustrations given herein are not to be regarded in any way as restrictions on, limits to, or express definitions of, any term or terms with which they are utilized. Instead, these examples or illustrations are to be regarded as being described with respect to one particular embodiment and as illustrative only. Those of ordinary skill in the art will appreciate that any term or terms with which these examples or illustrations are utilized will encompass other embodiments which may or may not be given therewith or elsewhere in the specification and all such embodiments are intended to be included within the scope of that term or terms.

In the foregoing specification, the invention has been described with reference to specific embodiments. However, one of ordinary skill in the art appreciates that various modifications and changes can be made without departing from the scope of the invention. Accordingly, the specification and figures are to be regarded in an illustrative rather than a restrictive sense, and all such modifications are intended to be included within the scope of invention.

Although the invention has been described with respect to specific embodiments thereof, these embodiments are merely illustrative, and not restrictive of the invention. The description herein of illustrated embodiments of the invention is not intended to be exhaustive or to limit the invention to the precise forms disclosed herein (and in particular, the inclusion of any particular embodiment, feature or function is not intended to limit the scope of the invention to such embodiment, feature or function). Rather, the description is intended to describe illustrative embodiments, features and functions in order to provide a person of ordinary skill in the art context to understand the invention without limiting the invention to any particularly described embodiment, feature or function. While specific embodiments of, and examples for, the invention are described herein for illustrative purposes only, various equivalent modifications are possible within the spirit and scope of the invention, as those skilled in the relevant art will recognize and appreciate. As indicated, these modifications may be made to the invention in light of the foregoing description of illustrated embodiments of the invention and are to be included within the spirit and scope of the invention. Thus, while the invention has been described herein with reference to particular embodiments thereof, a latitude of modification, various changes and substitutions are intended in the foregoing disclosures, and it will be appreciated that in some instances some features of embodiments of the invention will be employed without a corresponding use of other features without departing from the scope and spirit of the invention as set forth. Therefore, many modifications may be made to adapt a particular situation or material to the essential scope and spirit of the invention.

Respective appearances of the phrases "in one embodiment," "in an embodiment," or "in a specific embodiment" or similar terminology in various places throughout this specification are not necessarily referring to the same embodiment. Furthermore, the particular features, structures, or characteristics of any particular embodiment may be combined in any suitable manner with one or more other embodiments. It is to be understood that other variations and modifications of the embodiments described and illustrated herein are possible in light of the teachings herein and are to be considered as part of the spirit and scope of the invention.

In the description herein, numerous specific details are provided, such as examples of components and/or methods, to provide a thorough understanding of embodiments of the invention. One skilled in the relevant art will recognize, however, that an embodiment may be able to be practiced without one or more of the specific details, or with other apparatus, systems, assemblies, methods, components, materials, parts, and/or the like. In other instances, well-known structures, components, systems, materials, or operations are not specifically shown or described in detail to avoid obscuring aspects of embodiments of the invention. While the invention may be illustrated by using a particular embodiment, this is not and does not limit the invention to any particular embodiment and a person of ordinary skill in the art will recognize that additional embodiments are readily understandable and are a part of this invention.

It will also be appreciated that one or more of the elements depicted in the drawings/figures can also be implemented in a more separated or integrated manner, or even removed or rendered as inoperable in certain cases, as is useful in accordance with a particular application.

Benefits, other advantages, and solutions to problems have been described above with regard to specific embodiments. However, the benefits, advantages, solutions to problems, and any component(s) that may cause any benefit, advantage, or solution to occur or become more pronounced are not to be construed as a critical, required, or essential feature or component.

What is claimed is:

1. An electric vehicle supply equipment (EVSE) that supplies electricity to an electric vehicle (EV) being a load, comprising:
    a short-range wireless radio coupled to a processor and the short-range wireless radio coupled to an antenna to provide short-range wireless communications between the EVSE and one or more external devices;
    a coupler; and
    an arc fault detection circuit interruption (AFCI) device including:
        a controller including the processor and a memory; circuitry; and
        computer-readable firmware code stored in the memory which, when executed by the processor, causes the controller to:
        detect an arcing level of arcing between the coupler and a charge port of the electric vehicle (EV),
        compare the arcing level to a threshold level to determine a hazardous nature of arching, and
        accumulate information about a level of arcing, a duration of arcing, a number of times arching happened to predict the health of the coupler based on arc energy.

2. The electric vehicle supply equipment (EVSE) of claim 1, further comprising:
    a relay configured to open and close to supply power or cutoff power,
    wherein if the arcing is detected initiate a stop charging command to open the relay to cutoff the power to the charge port.

3. The electric vehicle supply equipment (EVSE) of claim 1, further comprising:
    a charging adapter being used between the coupler of the electric vehicle supply equipment (EVSE) and the charge port of the electric vehicle (EV) such that the arcing can be damaging to people and equipment, wherein the controller is configured to detect and stop the arcing before it becomes dangerous.

4. The electric vehicle supply equipment (EVSE) of claim 1, wherein the controller is configured to:
    monitor the arcing and overtime determine if conductors of the coupler and conductors of the charge port are worn out.

5. The electric vehicle supply equipment (EVSE) of claim 4, wherein the controller is configured to:
    predict when the arcing is going to occur in future.

6. The electric vehicle supply equipment (EVSE) of claim 5, wherein the controller is configured to:
    suggest replacing the coupler or the charge port.

7. The electric vehicle supply equipment (EVSE) of claim 1, wherein the controller is configured to:
    in case of no arcing cause the electric vehicle supply equipment (EVSE) to continue charging.

8. The electric vehicle supply equipment (EVSE) of claim 1, wherein the controller is configured to:
    record a time, a date and a location information of arcing and correlate the time, the date and the location information with billing to identify where arcing was a consistent problem.

9. A method for supplying electricity to an electric vehicle (EV) being a load, the method comprising:
    providing an electric vehicle supply equipment (EVSE) comprising:
        a short-range wireless radio coupled to a processor and the short-range wireless radio coupled to an antenna to provide short-range wireless communications between the EVSE and one or more external devices;
        a coupler; and
        an arc fault detection circuit interruption (AFCI) device including:
            a controller including the processor and a memory; circuitry; and
            computer-readable firmware code stored in the memory which, when executed by the processor, causes the controller to:
            detect an arcing level of arcing between the coupler and a charge port of the electric vehicle (EV),
            compare the arcing level to a threshold level to determine a hazardous nature of arching, and
            accumulate information about a level of arcing, a duration of arcing, a number of times arching happened to predict the health of the coupler based on arc energy.

10. The method of claim 9, further comprising:
    providing a relay configured to open and close to supply power or cutoff power,
    wherein if the arcing is detected initiate a stop charging command to open the relay to cutoff the power to the charge port.

11. The method of claim 9, further comprising:
    providing a charging adapter being used between the coupler of the electric vehicle supply equipment (EVSE) and the charge port of the electric vehicle (EV) such that the arcing can be damaging to people and equipment, wherein the controller is configured to detect and stop the arcing before it becomes dangerous.

12. The method of claim 9, wherein the controller is configured to:
    monitor the arcing and overtime determine if conductors of the coupler and conductors of the charge port are worn out.

13. The method of claim 12, wherein the controller is configured to:
    predict when the arcing is going to occur in future, and suggest replacing the coupler or the charge port.

14. The electric vehicle supply equipment (EVSE) of claim 1, wherein the short-range wireless radio comprises a Near Field Communication (NFC) radio that uses magnetic field induction to enable communication between devices when they're touched together or brought within a few centimeters of each other.

15. The method of claim 9, wherein the short-range wireless radio comprises a Near Field Communication (NFC) radio that uses magnetic field induction to enable communication between devices when they're touched together or brought within a few centimeters of each other.

16. The electric vehicle supply equipment (EVSE) of claim 1, wherein the controller to analyze the arcing level to determine not only if it is currently hazardous but if it is likely to become hazardous in a near term and recommend repair or replacement of the coupler and the charge port before damage occurs.

17. The electric vehicle supply equipment (EVSE) of claim 16, wherein the arcing happens when the electric vehicle supply equipment (EVSE) is unplugged in an unusual manner or whenever there is an electric power present on the charge port of the electric vehicle (EV) when there shouldn't be any, and wherein the arcing is generating a lot more electrical noise than a threshold.

18. The method of claim 9, wherein the controller to analyze the arcing level to determine not only if it is currently hazardous but if it is likely to become hazardous in a near term and recommend repair or replacement of the coupler and the charge port before damage occurs.

19. The method of claim 18, wherein the arcing happens when the electric vehicle supply equipment (EVSE) is unplugged in an unusual manner or whenever there is an electric power present on the charge port of the electric vehicle (EV) when there shouldn't be any, and wherein the arcing is generating a lot more electrical noise than a threshold.

\* \* \* \* \*